United States Patent
Kobayashi

(10) Patent No.: US 9,466,516 B2
(45) Date of Patent: Oct. 11, 2016

(54) METHOD OF MANUFACTURING THERMAL INSULATION WALL BODY

(71) Applicant: TOKYO ELECTRON LIMITED, Tokyo (JP)

(72) Inventor: Makoto Kobayashi, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 281 days.

(21) Appl. No.: 14/458,309

(22) Filed: Aug. 13, 2014

(65) Prior Publication Data

US 2015/0053329 A1    Feb. 26, 2015

(30) Foreign Application Priority Data

Aug. 21, 2013  (JP) .................. 2013-171673

(51) Int. Cl.
*B32B 7/08* (2006.01)
*B29C 65/00* (2006.01)
(Continued)

(52) U.S. Cl.
CPC ......... *H01L 21/67109* (2013.01); *F27D 11/10* (2013.01); *B29C 65/48* (2013.01);
(Continued)

(58) Field of Classification Search
CPC ..... H01L 21/67109; H05B 3/64; H05B 3/66; B29C 65/48; B29C 65/564; B29C 66/0224; B29C 66/02241; B29C 66/02245; B29C 66/432; B29C 66/4322; B29C 66/4342; B29C 66/50; B29C 66/51; B29C 66/52; B29C 66/524; B29C 66/5243; B29C 66/526; B29C 66/5263; F27D 1/0036; F27D 99/0006; Y10T 156/1062; Y10T 156/1066

USPC ............. 156/60, 91, 92, 153, 154, 184, 185, 156/187, 191, 196, 198, 211, 217, 218, 227, 156/250, 256, 258, 263, 264, 266, 304.1, 156/304.3, 304.5; 428/44, 45, 47, 51, 57, 428/80, 81, 98, 192

See application file for complete search history.

(56) References Cited

U.S. PATENT DOCUMENTS 4,489,920 A * 12/1984 Jones .................. F27D 1/00
  266/208
6,125,134 A *  9/2000 Jonsson ................ H05B 3/66
  373/119

(Continued)

FOREIGN PATENT DOCUMENTS

JP      08064546 A    8/1996
JP   2000182979 A    6/2000

*Primary Examiner* — Philip Tucker
*Assistant Examiner* — Brian R Slawski
(74) *Attorney, Agent, or Firm* — Nath, Goldberg & Meyer; Jerald L. Meyer

(57) ABSTRACT

A method of manufacturing a cylindrical thermal insulation wall body having a holding unit of a heater element formed in an inner peripheral surface includes processing a plate-shaped thermal insulation member such that a plurality of groove portions are formed at a predetermined pitch, processing the thermal insulation member such that an angle between either of the first surface and the second surface, and a third surface on which the groove portions are formed, is 90+180/n degrees, and manufacturing the cylindrical thermal insulation wall body by bonding a plurality of sectional thermal insulation members, wherein the plurality of sectional thermal insulation members are bonded such that the groove portions of the adjacent sectional thermal insulation members are aligned with each other and to form the holding unit in the inner peripheral surface of the cylindrical thermal insulation wall body.

6 Claims, 4 Drawing Sheets

(51) Int. Cl.
*B32B 37/00* (2006.01)
*B32B 38/10* (2006.01)
*B31F 1/00* (2006.01)
*B32B 38/04* (2006.01)
*B32B 3/02* (2006.01)
*B32B 3/00* (2006.01)
*H01L 21/67* (2006.01)
*F27D 11/10* (2006.01)
*H05B 3/66* (2006.01)
*B29C 65/48* (2006.01)
*F27B 17/00* (2006.01)
*F27D 1/00* (2006.01)

(52) U.S. Cl.
CPC ........ *B29C 66/0224* (2013.01); *B29C 66/432* (2013.01); *F27B 17/0025* (2013.01); *F27D 1/0036* (2013.01); *H05B 3/66* (2013.01)

(56) References Cited

U.S. PATENT DOCUMENTS

2008/0196641 A1* 8/2008 Johansson ............. F27D 1/0006 110/336
2008/0205864 A1* 8/2008 Kobayashi ............. F26B 23/06 392/416
2010/0212713 A1* 8/2010 Sasaki .................... H01L 35/32 136/233

* cited by examiner

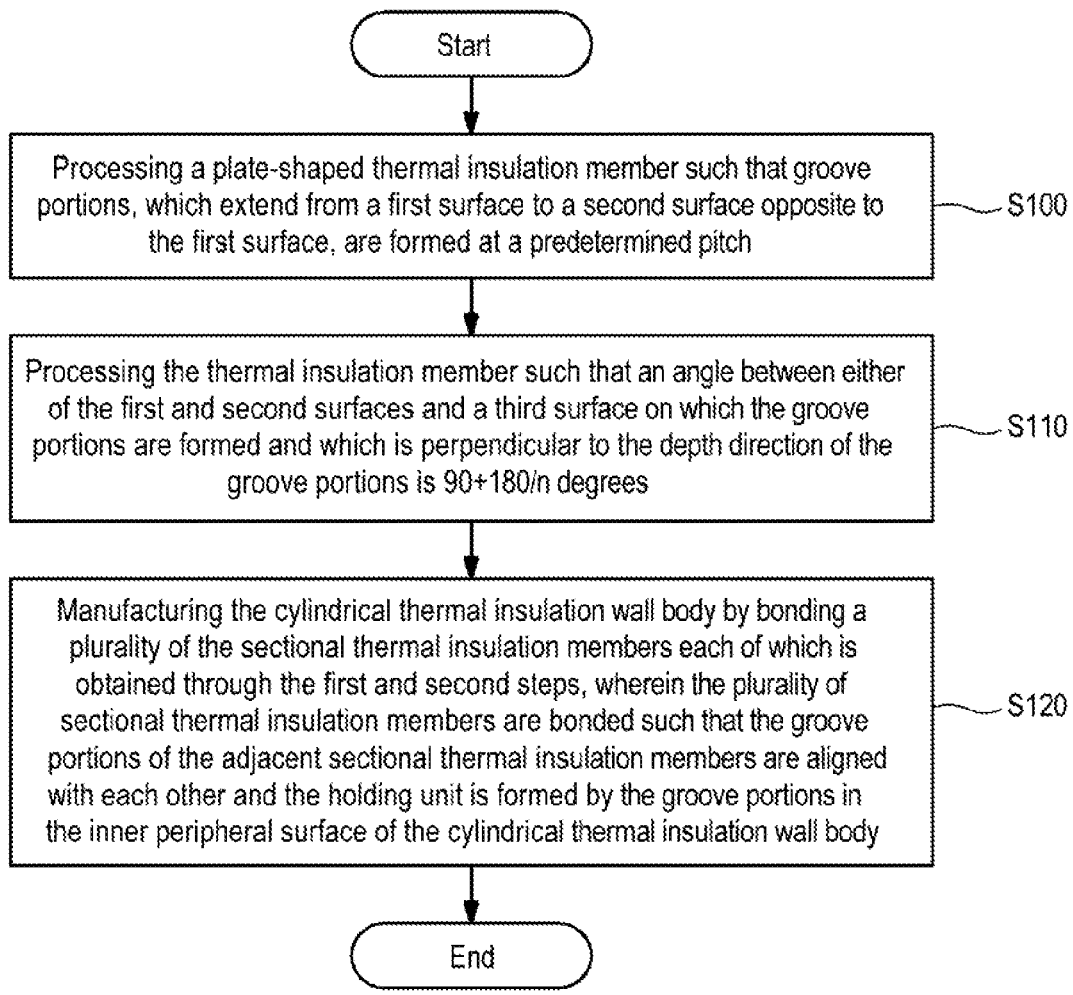

METHOD OF MANUFACTURING THERMAL INSULATION WALL BODY

CROSS-REFERENCE TO RELATED APPLICATION

This application claims the benefit of Japanese Patent Application No. 2013-171673, filed on Aug. 21, 2013, in the Japan Patent Office, the disclosure of which is incorporated herein in its entirety by reference.

TECHNICAL FIELD

The present disclosure relates to a method of manufacturing a thermal insulation wall body.

BACKGROUND

For example, in manufacturing a semiconductor device, processes such as a film forming process, an oxidation process, a diffusion process, an annealing process, and an etching process are performed on a semiconductor wafer, which is an object to be processed. When such processes are performed, a vertical heat treatment device, which is provided with a process vessel in which an object to be processed is accommodated and a heater unit disposed in an outer peripheral side of the process vessel to surround the process vessel, is used.

The heater unit of the vertical heat treatment device is configured to include, for example, a resistive heating element (heater element) and a circular cylindrical thermal insulation wall body installed around the heater element. Specifically, a holding unit configured to accommodate the heater element into the holding unit is installed in an inner peripheral side of the thermal insulation wall body, and the heater element is disposed in a spiral shape by the holding unit.

Here, the thermal insulation wall body in the vertical heat treatment device is formed by stacking a plurality of ring-shaped thermal insulation blocks having the holding unit in an axial direction. In addition, there is disclosed a thermal insulation wall body which is formed by dispersing a material of the thermal insulation wall body in an aqueous medium into a slurry phase, bringing the slurry into contact with a forming mold having a surface corresponding to the shape of the holding unit, and drying the slurry.

However, in the method of stacking a plurality of ring-shaped thermal insulation blocks in the axial direction, a long period of time and tremendous efforts are needed to manufacture the thermal insulation wall body. Further, in the above-described method of manufacturing the thermal insulation wall body, there are problems in that special equipment is required and it is difficult to form the holding unit having a depth sufficient to hold the heater element.

SUMMARY

Some embodiments of the present disclosure provide a method of manufacturing a thermal insulation wall body, which makes it possible to economically manufacture a thermal insulation wall body.

According to one embodiment of the present disclosure, provided is a method of manufacturing a cylindrical thermal insulation wall body having a holding unit of a heater element formed in an inner peripheral surface, the method including processing a plate-shaped thermal insulation member such that a plurality of groove portions are formed at a predetermined pitch, the plurality of groove portions extending from a first surface to a second surface opposite to the first surface, processing the thermal insulation member such that an angle between either of the first surface and the second surface, and a third surface, on which the groove portions are formed and which is perpendicular to a depth direction of the groove portions, is 90+180/n degrees, wherein n is a natural number of three or larger, and manufacturing the cylindrical thermal insulation wall body by bonding a plurality of sectional thermal insulation members, wherein the plurality of sectional thermal insulation members are bonded such that the groove portions of the adjacent sectional thermal insulation members are aligned with each other and to form the holding unit in the inner peripheral surface of the cylindrical thermal insulation wall body.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a flowchart of an example of a method of manufacturing a thermal insulation wall body according to an embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

(Vertical Heat Treatment Device)

First, an example of a fundamental configuration of a vertical heat treatment device having a thermal insulation wall body according to one embodiment will be described. In addition, in this embodiment, a vertical heat treatment device configured to manufacture a semiconductor device will be described as an example. However, the present disclosure is not limited thereto and may include various types of heat treatment devices.

Figure 1:
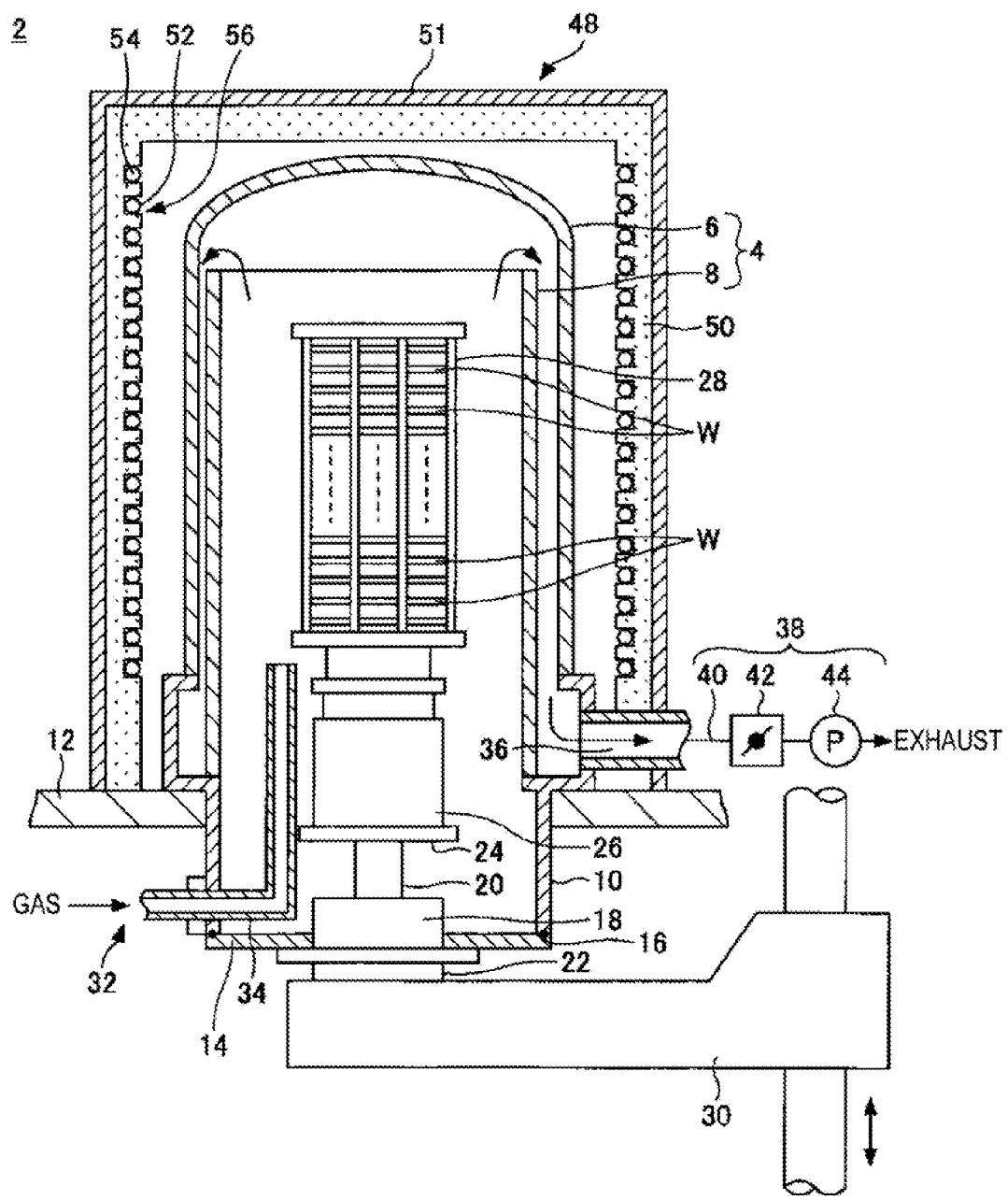
FIG. 1 is a schematic view of a configuration of an example of a vertical heat treatment device according to one embodiment.

FIG. 1 is a schematic view of a configuration of an example of the vertical heat treatment device according to the embodiment.

As shown in FIG. 1, a vertical heat treatment device 2 has a process vessel 4 in which a longitudinal direction is parallel to a vertical direction. The process vessel 4 is configured to have a double tube structure that includes an outer tube 6 having a ceiling and a circular cylindrical inner tube 8 concentrically disposed in an inner peripheral side of the outer tube 6.

The outer tube 6 and the inner tube 8 are formed of a heat resistant material such as quartz. Further, the lower ends of the outer tube 6 and the inner tube 8 are supported by a manifold 10 formed of stainless steel or the like. The manifold 10 is fixed to a base plate 12. In addition, without installing the manifold 10, the entirety of the process vessel 4 may be formed, for example, of quartz.

A disc-shaped cap portion 14, for example, made of stainless steel, is airtightly installed to an opening of the lower end of the manifold 10 via a seal member 16 such as an O-ring. Further, a rotary shaft 20, for example, which can be rotated in an airtight state with a magnetic fluid seal 18, is inserted to extend through an approximately central portion of the cap portion 14. The lower end of the rotary shaft 20 is connected to a rotary mechanism 22, and the upper end of the rotary shaft 20 is fixed to a table 24, for example, made of stainless steel.

A thermal insulation container 26, for example, made of quartz, is installed on the table 24. Also, a wafer boat 28, for example, made of quartz, as a support member, is mounted on the thermal insulation container 26.

A plurality of sheets, for example, 50 to 150 sheets, of semiconductor wafers (hereafter, referred to as wafers W) as objects to be processed is accommodated at predetermined intervals, for example, a pitch of 10 mm, in the wafer boat 28. The wafer boat 28, the thermal insulation container 26, the table 24, and the cap portion 14 are loaded in and unloaded from the process vessel 4, for example, by a lift mechanism 30 that is a boat elevator.

A gas introduction unit 32 configured to introduce a process gas into the process vessel 4 is installed in a lower portion of the manifold 10. The gas introduction unit 32 has a gas nozzle 34 installed to airtightly penetrate through the manifold 10. In addition, although FIG. 1 shows the configuration having the single gas introduction unit 32 installed, the present disclosure is not limited thereto. Depending on the number of types of gases to be used, a vertical heat treatment device may be configured to include any suitable number of gas introduction units 32. Further, a flow rate of the gas introduced into the process vessel 4 from the gas nozzle 34 is controlled by a flow rate control mechanism (not shown).

A gas outlet 36 is installed in an upper portion of the manifold 10, and an exhaust system 38 is connected to the gas outlet 36. The exhaust system 38 includes an exhaust channel 40 connected to the gas outlet 36, and a pressure control valve 42 and a vacuum pump 44 connected to the exhaust channel 40 in this order. The exhaust system 38 may exhaust the interior of the process vessel 4 while controlling an internal pressure of the process vessel 4.

A heater unit 48 configured to surround the process vessel 4 and heat the objects to be processed such as wafers W is installed in an outer peripheral side of the process vessel 4. The heater unit 48 has a cylindrical thermal insulation wall body 50 having a ceiling surface. Hereinafter, the thermal insulation wall body 50 according to the embodiment and the heater unit 48 having the thermal insulation wall body 50 will be described in detail.

[Thermal Insulation Wall Body and Heater Unit]

As described above, the heater unit 48 includes the cylindrical thermal insulation wall body 50. The thermal insulation wall body 50 may be formed, for example, of a mixture of silica and alumina which has low heat conductivity and is soft and amorphous. Also, hereinafter, the terms "axial direction," "circumferential direction," and "diameter direction" used herein refer to an axial direction, a circumferential direction, and a diameter direction of the cylindrical thermal insulation wall body 50, respectively.

The thermal insulation wall body 50 is disposed so that its inner peripheral surface is spaced apart by a predetermined distance from the outer peripheral surface of the process vessel 4. In addition, a protective cover 51 formed of stainless steel or the like is installed on the outer periphery of the thermal insulation wall body 50 so as to cover the entire outer periphery of the thermal insulation wall body 50.

FIGS. 2A to 2D show schematic views of examples of the thermal insulation wall body 50 according to the embodiment as viewed from one side in the axial direction. Further, in FIGS. 2A to 2D, the ceiling surface of the thermal insulation wall body 50 is omitted.

The cylindrical thermal insulation wall body 50 is formed with a plurality of sectional thermal insulation members 52, which are divided from each other at least in a circumferential direction and each has division surfaces formed at both ends in the circumferential direction.

Figure 2A:
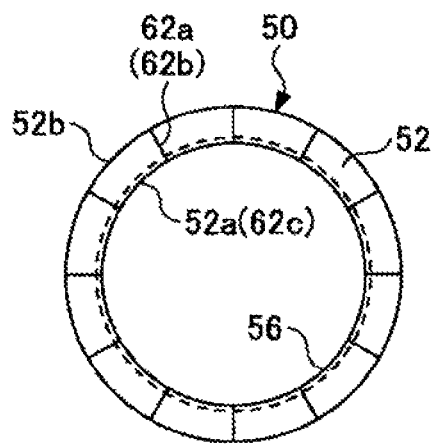
FIGS. 2A to 2D are schematic views of examples of a thermal insulation wall body according to the embodiment as viewed from one side in an axial direction.

In an example shown in FIG. 2A, the cylindrical thermal insulation wall body 50 is in the shape of a circular cylinder, and the circular cylindrical thermal insulation wall body 50 includes twelve sectional thermal insulation members 52 in the circumferential direction. However, the number of the sectional thermal insulation members 52 of the thermal insulation wall body 50 is not limited thereto and the thermal insulation wall body 50 may be divided into, for example, two, four, or any suitable number.

Figure 2B:
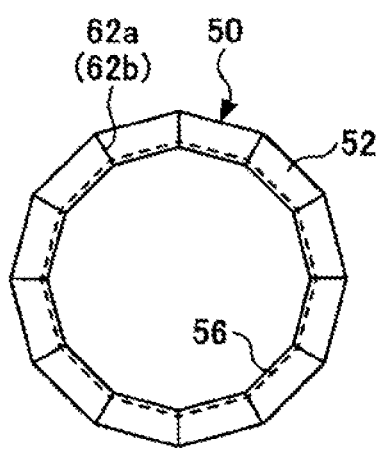

In addition, the cylindrical thermal insulation wall body 50 may be in the shape of a polygonal cylinder, and has a dodecagonal cylinder in an example shown in FIG. 2B. When the cylindrical thermal insulation wall body 50 has a polygonal cylindrical shape, one of the sectional thermal insulation members 52 corresponds to one side of the polygon. That is, in the example shown in FIG. 2B, the twelve sectional thermal insulation members 52 are bonded to each other to form the dodecagonal cylindrical thermal insulation wall body 50. Also, although the example shown in FIG. 2B shows the dodecagonal cylinder as an example, the present disclosure is not limited thereto and the cylindrical thermal insulation wall body 50 may have another polygonal cylindrical shape.

Figure 2C:
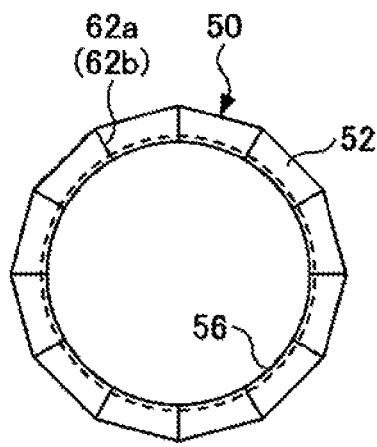
Figure 2D:
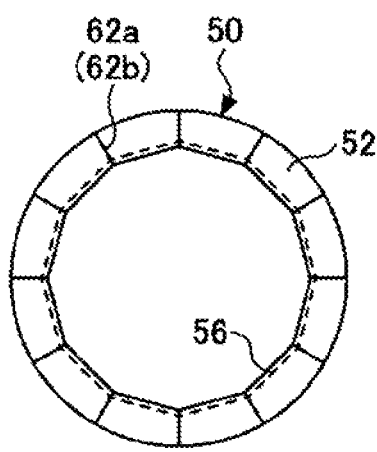

As another shape, the cylindrical thermal insulation wall body 50 may have the outer periphery in a polygonal shape and the inner periphery in a circular shape as shown in FIG. 2C, or have the outer periphery in a circular shape and the inner periphery in a polygonal shape as shown in FIG. 2D.

In addition, the adjacent sectional thermal insulation members 52 in the circumferential direction of the cylindrical thermal insulation wall body 50 are, in some embodiments, bonded to each other in order to increase internal thermal insulation of the cylindrical thermal insulation wall body 50.

Further, groove portions 56 which are a holding unit configured to accommodate a heater element(s) 54 into the holding unit are formed in the inner peripheral surface of the thermal insulation wall body 50.

The groove portions 56 may be formed into a spiral shape along the inner peripheral surface of the thermal insulation wall body 50, in which the central axis of the cylindrical thermal insulation wall body 50 is an axis of the spiral shape. In addition, a predetermined number of the groove portions 56, each of which is formed perpendicular to the axis of the thermal insulation wall body 50, may be formed at predetermined intervals along the axial direction of the thermal insulation wall body 50. In this case, the heater elements 54 are disposed in the groove portions 56, respectively, and arranged so as to extend in the axial direction between the adjacent groove portions 56. Further, an element length of the heater element 54 depends on the size of the heater unit and is generally 15 to 50 m or so. Accordingly, depending on the size of the heater unit and the like, the heater element 54 is divided and arranged into a plurality of zones, for example, four zones, in the axial direction. Further, a temperature of each zone can be independently controlled, by a control part (not shown), based on a temperature detected by a thermocouple (not shown) installed in each zone in the vicinity of the thermal insulation wall body 50.

The groove portion 56 is formed to have a depth larger than the radius of the heater element 54 disposed in the groove portion 56. With this configuration, the heater element 54 disposed in the groove portion 56 can be prevented from escaping from the groove portion 56. In addition, a holding member (not shown) may be installed between the inner peripheral surface of the thermal insulation wall body 50 and an outer side of the outer tube 6 of FIG. 1 in order to keep the heater element 54 in the groove portion 56.

The heater element 54 may be formed in a spiral shape along its lengthwise direction or in a corrugated shape.

(Method of Manufacturing Thermal Insulation Wall Body)

Next, the method of manufacturing the thermal insulation wall body according to the above-described embodiment will be described. FIG. 3 shows a flowchart of an example of the method of manufacturing the thermal insulation wall body according to the embodiment. Further, FIGS. 4A to 4F show schematic views illustrating the method of manufacturing the thermal insulation wall body according to the embodiment.

As shown in FIG. 3, the method of manufacturing the thermal insulation wall body according to the embodiment is a method of manufacturing the cylindrical thermal insulation wall body having the holding unit for the heater element formed in the inner peripheral surface. The method includes a first step S100 of processing a plate-shaped thermal insulation member such that groove portions, which extend from a first surface to a second surface opposite to the first surface, are formed at a predetermined pitch, a second step S110 of processing the thermal insulation member such that an angle between either of the first surface and the second surface, and a third surface, on which the groove portions are formed and which is perpendicular to the depth direction of the groove portions, is 90+180/n degrees, and a third step S120 of manufacturing the cylindrical thermal insulation wall body by bonding a plurality of the sectional thermal insulation members each of which is obtained through the first and second steps, in which the plurality of sectional thermal insulation members are bonded such that the groove portions of the adjacent sectional thermal insulation members are aligned with each other and the holding unit is formed by the groove portions in the inner peripheral surface of the cylindrical thermal insulation wall body.

In addition, another processing step may be included, if necessary. For example, an additional processing step, which will be described later, performed on the sectional thermal insulation members may be provided between the second step and the third step.

The respective steps will be described with reference to FIGS. 4A to 4F. FIGS. 4A to 4F show schematic views illustrating the method of manufacturing the thermal insulation wall body according to the embodiment.

Figure 4A:
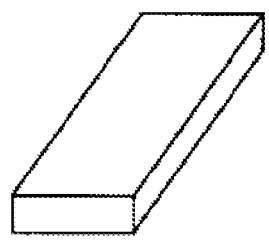
FIGS. 4A to 4F are schematic views illustrating the method of manufacturing the thermal insulation wall body according to the embodiment.
Figure 4D:
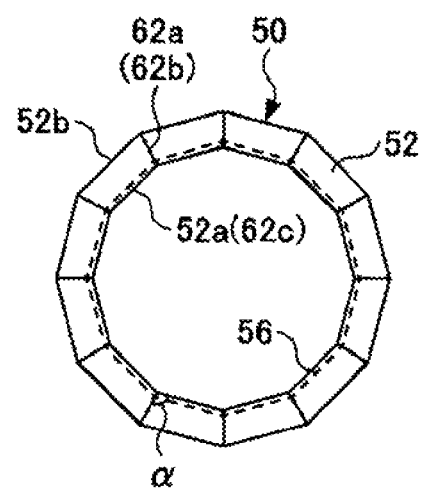
Figure 4B:
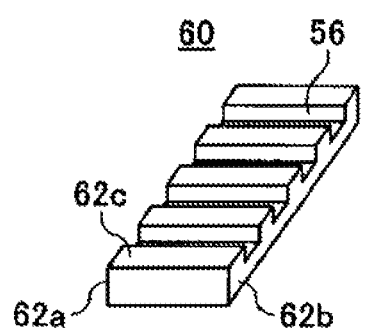

In the first step S100, the groove portions 56 as shown in FIG. 4B, which become the holding unit configured to hold the heater element 54, are formed on a plate-shaped thermal insulation member 60 shown as an example in FIG. 4A. The groove portions 56 are formed in the thermal insulation member 60 to extend from a first surface 62a to a second surface 62b which is a surface opposite to the first surface 62a. In addition, a predetermined number of the groove portions 56 are formed at a predetermined pitch of, for example, 33.5 mm.

The groove portions 56 may be formed by well-known mechanical machining.

The groove portion 56 preferably has a depth larger than the radius of the heater element 54. For example, when the heater element 54 of ϕ21.5 mm (having a radius of about 10.7 mm) is used, the groove portion 56 may have a depth of 20.75 mm.

The pitch of the groove portions 56 is not specifically limited and is set to correspond to a desired pitch of the heater element 54 disposed in the thermal insulation wall body 50.

In addition, the groove portions 56 may be formed to extend in a direction perpendicular to the first surface 62a and the second surface 62b or may be formed at a predetermined angle with respect to the direction perpendicular to the first surface 62a and the second surface 62b. In the former case, in the thermal insulation wall body 50 to be manufactured, the groove portions 56, each of which is formed perpendicular to the axis of the thermal insulation wall body 50, are formed in a plural number at predetermined intervals in the axial direction of the thermal insulation wall body 50. In the latter case, the groove portions 56 are formed into a spiral shape having the central axis of the cylindrical thermal insulation wall body 50 as its axis.

Figure 4E:
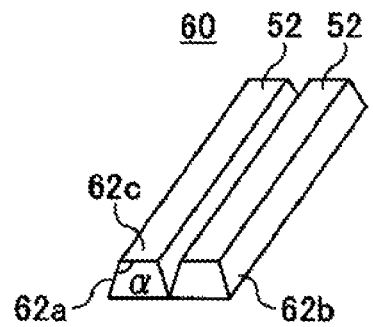
Figure 4C:
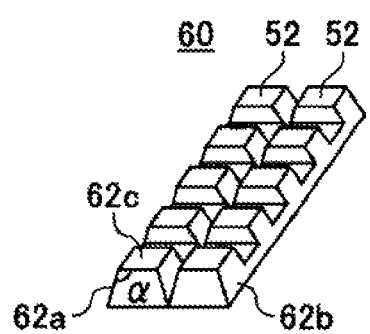

In the second step S110, the thermal insulation member 60 having the groove portions 56 formed by the first step S100 as shown in FIG. 4B is processed such that an angle a becomes 90+180/n degrees (wherein n is a natural number of three or more) as shown in FIG. 4C. Here, the angle a means an angle between either of the first surface 62a and a second surface 62b, and a third surface 62c. The third surface 62c on which the groove portions 56 are formed is perpendicular to the depth direction of the groove portion 56. In generally, an internal angle of a regular polygon is represented by 180(n−2)/n degrees. As shown in FIGS. 4D, an internal angle of a regular polygon is formed by two adjacent sectional thermal insulation members 52, and the sum of 2α degrees and 180(n−2)/n degrees becomes a circumference of 360 degrees when considering the angle α between the first surface 62a and the third surface 62c in the sectional thermal insulation member 52. Therefore, the angle a corresponding to 90+180/n (i.e., α=90+180/n) degrees is derived by the above calculation. That is, when the sectional thermal insulation members 52 to manufacture the thermal insulation wall body 50 are formed by the second step S110 and a plurality of the sectional thermal insulation members 52 are bonded in the later-described third step S 120, the polygonal cylindrical thermal insulation wall body 50 may be manufactured.

Although it might be affected by a size of the plate-shaped thermal insulation member 60 to be used or a desired size of the thermal insulation wall body 50 to be manufactured, the plurality of sectional thermal insulation members 52 are preferably manufactured from one sheet of the plate-shaped thermal insulation member 60. When the plurality of sectional thermal insulation members 52 are obtained from one sheet of the plate-shaped thermal insulation member 60, the positions of the groove portions 56 may be easily aligned with each other in the later-described third step S120 since positions of the groove portions 56 of the respective sectional thermal insulation members 52 correspond to each other. Further, in an example shown in FIGS. 4A to 4F, two sectional thermal insulation members 52 are manufactured from one sheet of the plate-shaped thermal insulation member 60 as an example.

Figure 4F:
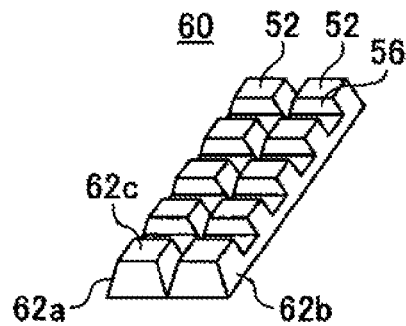

The order of the first step S100 and the second step S110 is not limited thereto. As shown in FIGS. 4E and 4F, the second step S110 may be first performed and the first step S100 may then be performed.

The plurality of sectional thermal insulation members 52 manufactured through the first step S100 and the second step S110 are bonded in the third step S120 to manufacture the thermal insulation wall body 50 according to the embodiment as shown in FIG. 4D. Here, the plurality of sectional thermal insulation members 52 are bonded such that the groove portions 56 of the adjacent sectional thermal insulation members 52 are aligned with each other to form the holding unit of the heater element 54 in the inner peripheral surface of the cylindrical thermal insulation wall body 50.

A method of bonding the plurality of sectional thermal insulation members 52 is not specifically limited as long as the adjacent sectional thermal insulation members 52 bonded to each other provide a good airtightness environment. For example, the bonding surfaces (first surface and/or second surface) may be bonded with an adhesive. In such a case, the adhesive need not be applied to the entire bonding surfaces and may be applied only to portions in the radial direction of the cylindrical thermal insulation wall body. Further, the adhesive is not specifically limited if it is heat resistant, and its examples may include a heat resistant adhesive containing oxide such as silica or alumina.

Also, the adjacent sectional thermal insulation members are fixed with pin-shaped members in the outer peripheral surface, the top surface or the bottom surface of the cylindrical thermal insulation wall body. Alternatively, the bonding surfaces may have insertion holes formed in the bonding surfaces and be bonded to each other with rod fixing members, pin fixing members or the like. Alternatively, a convex portion may be formed in one of the adjacent bonding surfaces and a concave portion mating with the convex portion may be formed in the other.

The plurality of sectional thermal insulation members 52 may also be bonded by a band member, for example, made of metal or the like, which covers the outer periphery of the cylindrical thermal insulation wall body. A plurality of band members may be arranged in the axial direction of the cylindrical thermal insulation wall body. Also, a thickness or the like of the band member is not specifically limited.

A heat resistant member (not shown) which is thermally shrinkable may be disposed between the bonding surfaces of the adjacent sectional thermal insulation members. With this configuration, even when the thermal insulation wall body is thermally shrunk, a shrunk amount of the thermal insulation wall body may be absorbed. Further, the thermally shrinkable heat resistant member may include a blanket-shaped heat resistant member and the like and specifically include ceramic fiber such as alumina fiber and silica fiber.

After the sectional thermal insulation members 52 are formed through the first step S100 and the second step S110 and before the third step S120 is performed, an rounding process is performed in some embodiments on at least one of a fourth surface 52a (corresponding to 62c) and a fifth surface 52b of each sectional thermal insulation member 52, which respectively correspond to the inner peripheral surface and the outer peripheral surface of the cylindrical thermal insulation wall body 50. Accordingly, this is preferable because the inner periphery and/or the outer periphery of the cylindrical thermal insulation wall body 50 to be obtained may be formed in a circular cylindrical shape.

Conventionally, a cylindrical thermal insulation wall body of a vertical heat treatment device has been manufactured by processing a plate-shaped thermal insulation member into a ring shape and forming the holding unit of the heater element therein. These members are finally stacked one above the other in a plural number to become the cylindrical thermal insulation wall body. However, the conventional method of manufacturing the thermal insulation wall body has a low material utilization efficiency of the plate-shaped thermal insulation members and high costs. Further, forming the holding unit in a spiral shape needs complicated processing to be performed on the inner peripheral surface of the ring-shaped thermal insulation member, and therefore, difficulty and costs for manufacturing the thermal insulation wall body are increased.

A method using suction molding has also been known as the method of manufacturing the cylindrical thermal insulation wall body of the vertical heat treatment device. According to this method, a thermal insulation wall body having a predetermined surface shape may be manufactured by dispersing a material of the thermal insulation wall body in an aqueous medium into a slurry phase, bringing the slurry into contact with a forming mold having a surface corresponding to the shape of the holding unit, and drying the slurry. However, the method using suction molding makes it difficult to form the holding unit deep enough to hold the heater element. In addition, special equipment is necessary to perform the suction molding.

In the method of manufacturing the thermal insulation wall body according to the embodiment of the present disclosure, since the groove portions can be formed from the plate-shaped thermal insulation members, a process of forming groove portions or processes for other various designs can be easily performed. Accordingly, costs for manufacturing the thermal insulation wall body are reduced. Further, since the material utilization efficiency of the plate-shaped thermal insulation members is increased, material costs are also reduced. Furthermore, in the method of manufacturing the thermal insulation wall body according to the embodiment, since the processes are easy to perform, a large thermal insulation wall body can be easily realized. It has been recently considered to use a semiconductor wafer having a diameter of 450 mm instead of the currently used semiconductor wafer having a diameter of 300 mm. Along with the enlargement of the substrate to be processed, a vertical substrate processing apparatus capable of manufacturing a large substrate is required in response to the enlargement. According to the method of manufacturing the thermal insulation wall body of the present embodiment, a large thermal insulation wall body can be easily manufactured, even in manufacturing a thermal insulation wall body of a vertical heat treatment device for a wafer having a diameter of 450 mm, by using a large thermal insulation member as a raw material.

In addition, in the method of manufacturing the thermal insulation wall body according to the embodiment, although it might be affected by the size of the plate-shaped thermal insulation member to be used or the desired size of the thermal insulation wall body to be manufactured, a plurality of sectional thermal insulation members can be manufactured from one sheet of the plate-shaped thermal insulation member. Further, even when the sectional thermal insulation members are manufactured from a plurality of different plate-shaped thermal insulation members, the groove portions can easily correspond to or align with one another in bonding of the sectional thermal insulation members by unifying depths, widths and pitches of the groove portions.

Furthermore, in the method of manufacturing the thermal insulation wall body according to the embodiment, an area of the bonding surfaces is small as compared with a case where ring-shaped thermal insulation members are stacked one above the other. Accordingly, it is possible to obtain a thermal insulation wall body having a good thermal insulation.

According to some embodiments of the present disclosure, it is possible to provide a method of manufacturing a thermal insulation member capable of manufacturing a thermal insulation member in a cost-effective manner.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a cylindrical thermal insulation wall body having a holding unit of a heater element formed in an inner peripheral surface, the method comprising:
   processing a plate-shaped thermal insulation member such that a plurality of groove portions are formed at a predetermined pitch, the plurality of groove portions extending from a first surface to a second surface opposite to the first surface;
   processing the thermal insulation member such that an angle between either of the first surface and the second surface, and a third surface, on which the groove portions are formed and which is perpendicular to a depth direction of the groove portions, is 90+180/n degrees, wherein n is a natural number of three or larger; and
   manufacturing the cylindrical thermal insulation wall body by bonding a plurality of sectional thermal insulation members, wherein the plurality of sectional thermal insulation members are bonded such that the groove portions of the adjacent sectional thermal insulation members are aligned with each other and to form the holding unit in the inner peripheral surface of the cylindrical thermal insulation wall body.

2. The method of claim 1, wherein the bonding in the manufacturing the cylindrical thermal insulation wall body comprises one of processes including i) using an adhesive, ii) fixing adjacent sectional thermal insulation members with a pin-shaped member in an outer peripheral surface, a top surface or a bottom surface of the thermal insulation wall body, iii) forming a convex portion in one of the adjacent sectional thermal insulation members and a concave portion mating with the convex portion in the other one, and iv) covering an outer periphery of the thermal insulation wall body by a band member.

3. The method of claim 1, wherein the manufacturing the cylindrical thermal insulation wall body comprises disposing a thermally shrinkable heat resistant member between bonding surfaces of the adjacent sectional thermal insulation members.

4. The method of claim 1, wherein in the processing a plate-shaped thermal insulation member, the groove portions are formed to extend in a direction perpendicular to the first surface and the second surface.

5. The method of claim 1, wherein in the processing a plate-shaped thermal insulation member, the groove portions are formed to extend at a predetermined angle with respect to a direction perpendicular to the first surface and the second surface.

6. The method of claim 1, wherein before the manufacturing the cylindrical thermal insulation wall body, rounding process is performed on at least one of the inner peripheral surface and an outer peripheral surface of the thermal insulation wall body.

* * * * *